United States Patent [19]

Schröder

[11] 4,218,662

[45] Aug. 19, 1980

[54] CIRCUIT ARRANGEMENT FOR OPTIONAL DYNAMIC COMPRESSION OR EXPANSION

[75] Inventor: Ernst Schröder, Hanover, Fed. Rep. of Germany

[73] Assignee: Licentia Patent-Verwaltungs-G.m.b.H., Frankfurt am Main, Fed. Rep. of Germany

[21] Appl. No.: 931,394

[22] Filed: Aug. 4, 1978

[30] Foreign Application Priority Data

Aug. 6, 1977 [DE] Fed. Rep. of Germany ........ 2735597
Dec. 10, 1977 [DE] Fed. Rep. of Germany ........ 2755144

[51] Int. Cl.² .......................... H04B 1/64; H03G 7/00
[52] U.S. Cl. ...................................... 333/14; 307/237; 307/264; 330/51; 330/86; 330/144; 330/282; 330/284
[58] Field of Search .................... 333/14; 330/86, 51, 330/110, 144, 145, 282, 284; 307/264; 328/168, 169, 171

[56] References Cited

U.S. PATENT DOCUMENTS

| | | | |
|---|---|---|---|
| 3,024,313 | 3/1962 | Ensink et al. | 333/14 X |
| 3,815,039 | 6/1974 | Fujisawa et al. | 333/14 X |
| 4,099,134 | 7/1978 | Schroder | 330/86 X |
| 4,119,922 | 10/1978 | Schroder | 330/86 |

*Primary Examiner*—Paul L. Gensler
*Attorney, Agent, or Firm*—Spencer & Kaye

[57] ABSTRACT

A circuit arrangement for automatic dynamic compression and/or expansion having an auxiliary circuit provided in the useful signal path or in the negative feedback path of an amplifier. The auxiliary circuit has a first and a second connection point. On the one hand there are arranged between the first and the second connection point a first damping or amplifying member, an electronically controllable damping member and a second damping or amplifying member connected in series. On the other hand means for limiting the voltage or current are arranged between the first and second connection point.

17 Claims, 2 Drawing Figures

CIRCUIT ARRANGEMENT FOR OPTIONAL DYNAMIC COMPRESSION OR EXPANSION

BACKGROUND OF THE INVENTION

Compander systems comprise basically a compression circuit for the dynamic narrowing of a useful signal such e.g. as a LF voltage prior to transmission or storage and and expansion circuit for dynamic widening after the transmission or prior to the reproduction of a previously stored signal. The adjusting members frequently provided for such compander systems of the above-mentioned type serve to reduce or increase the signal amplitude and/or to influence the frequency of the signal to be dealt with, the control signal necessary for controlling the adjusting member being derived from the input or output signal of the compander circuit.

A corresponding system is known from U.S. Pat. No. 3,969,680. In such a system there is provided in a useful signal path a negatively back-coupled amplifier for the useful signal the inverting input of which is connected via a negative feedback path including an electronically controllable impedance to the output of the amplifier. From the output or input of the useful signal path there is branched off a path in which there is derived from the useful signal a control voltage which is applied to the electronically controllable impedance.

Moreover from the German Offenlegungsschrift 22 18 823 and U.S. Pat. No. 3,815,039 it is known, in an amplifier which can be changed over between two operating conditions, to effect the change of amplification by means of a controllable impedance which in the one operating condition of the amplifier is connected to a negative feedback path of the amplifier and in the other operating condition is connected to the input of the amplifier.

The circuits provided for the generation of the control voltage for the controllable negative feedback path of a voltage divider have as a rule unavoidable time constants, hence cause delays of the control voltage. There is the possibility that upon a rapid rise of the useful input signal the change of amplification of the said amplifier that in itself is necessary cannot follow this rise and therefore a so-called overswing occurs. In this manner there occurs at the output of the compander system, during compression, a momentarily excessively high output signal. A corresponding likewise undesired effect occurs during expansion when the amplitude of the useful input signal changes very rapidly.

For the avoidance of the disadvantage described one might think of limiting that voltage which in the case of compression exists over the negative feedback path and in the case of expansion exists over the corresponding partial impedance of the said voltage divider. This proposal is the subject of German Offenlegungsschrift 26 19 192 and U.S. Pat. No. 4,119,922.

It has been found that difficulties arise if for the limiting switch means there are employed components or circuit arrangements of which the threshold value at which the limitation begins is equal to or higher than the maximum permissible voltage on those impedances the voltage drop of which is to be limited.

SUMMARY OF THE INVENTION

The invention is therefore based on the problem of providing a circuit arrangement of the type referred to initially in which the said desired limiting is possible even if the limiting means have a threshold value which is not related to the maximum voltage permissible for the controllable impedance.

According to the invention in the negative feedback path of an amplifier in a circuit arrangement for automatic dynamic compression and/or expansion there are arranged on one hand between a first and a second connection point a first damping or amplifying member, an electronically controllable damping member and a second damping or amplifying member connected in series. On the other hand means for limiting the voltage or current are arranged between the first and second connection point.

DESCRIPTION OF THE PREFERRED EMBODIMENTS

Figure 1:
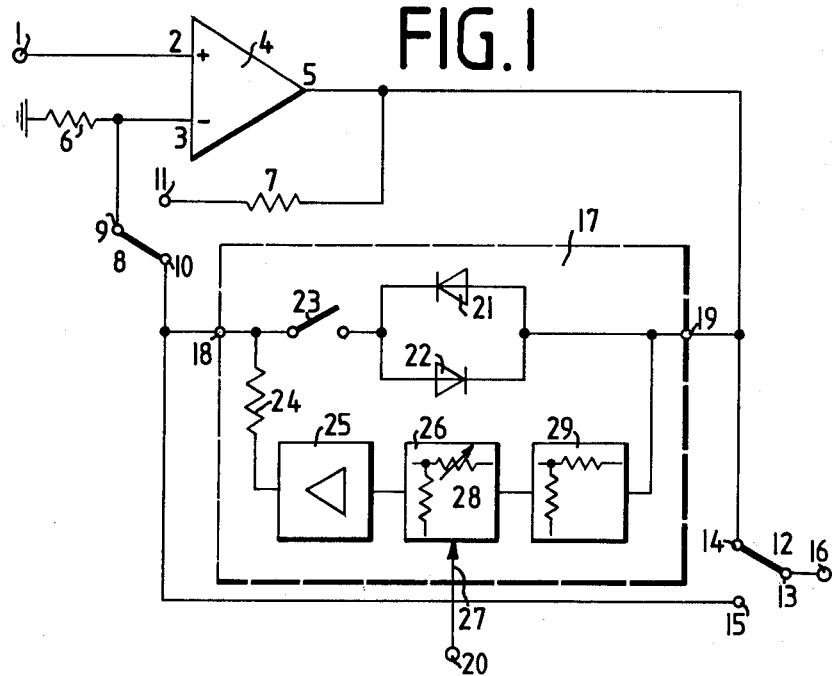
FIGS. 1 and 2 show two circuit arrangements as practical examples of the invention, which circuits may be used in a compander system selectively for automatic dynamic compression or expansion. The useful signal to be varied in dynamic, for example a LF signal, is fed to an input terminal 1, whilst the treated useful signal can be taken off at an output terminal 16 both in the case of expansion and in the case of compression.

In FIG. 1 the input terminal 1 is connected to the non-inverting input 2 of an amplifier 4 constructed as a differential amplifier. The inverting input 3 of the amplifier 4 is connected via a first resistor 6 to a reference voltage (ground) and can be connected selectively via a middle contact 9 of a second switch 8 and via its first and second contacts 11, 10 and via a negative back-coupling resistor 7 or an auxiliary circuit 17 to the output 5 of the amplifier. The auxiliary circuit 17 represents in principle a controllable damping or amplifying member 26 the propagation constant of which is controllable by means of a control voltage applied to the terminal 20. For this reason the terminal 20 is connected to the control input 27 of an electronically controllable adjusting member. The electronically controllable adjusting member 28 advantageously consists e.g. of a field effect transistor. The electronically controllable adjusting member 28 and a resistor connected to a reference voltage (ground) form an electronically controllable damping member 26. It is also possible to arrange the electronically controllable adjusting member 28 between the signal path and a reference voltage (ground) and the resistor in series in the signal path. The electronically controllable damping member 26 is connected on the one hand via a damping member 29 to a first circuit contact 19 of the auxiliary circuit 17, and on the other hand via an amplifying member 25 to a second circuit contact 18 of the auxiliary circuit 17.

The output 16 of the circuit arrangement described can be connected via a middle contact 13 of a first switch 12 and its first or second contact 14, 15 selectively to the output 5 of the amplifier 4 (contact 14) or to the second connection point 18 of the auxiliary circuit 17.

In the setting illustrated of the two switches 12 and 8 the auxiliary circuit 17 is arranged in the negative feedback branch of the amplifier 4. The electronically controllable adjusting member 28 is so constructed that its resistance becomes smaller with increasing control voltage on its control input 27. In the setting illustrated of the two switches 12 and 8 the circuit arrangement described effects a compression of the useful signals fed to the input terminal 1, if a control voltage is applied to the control input 27 of the electronically controllable adjusting member 28, the control signal being so derived from the useful signal that with increasing useful signal it likewise increases. This compression effect of the circuit arrangement described is explained by the signal available at the tapping of the voltage divider in the electronically controllable damping member 26 being increased. The propagation constant in the useful signal path is reduced by the increase of the propagation constant in the back-coupling path of the amplifier 4.

In order with the circuit arrangement described—on the assumption that the control voltage for the electronically controlling adjusting member 28 increases with increasing useful signal—to effect a dynamic expansion of the useful signals fed to the input terminal 1, it is necessary to change the switches 12 and 8 over into the other setting, not illustrated. In this case the amplifier 4 negatively back-coupled via the negative feedback resistor 7 has a constant propagation constant. The useful signal occurring at the output 5 of the amplifier 4 is fed to the first connection point 19 of the auxiliary circuit 17. The auxiliary circuit 17 is in this case like a voltage divider which consists essentially of the electronically controllable damping member 26. This voltage is applied via the amplifying member 25 to the second connection point 18 of the auxiliary circuit 17. The second connection point 18 of the auxiliary circuit 17 in the case described is then connected via the first switch 12 to the output terminal 16, so that the expanded useful signal can be taken off there. The expansion effect of such a circuit arrangement depends—as assumed above—on the control voltage increasing with increasing useful signal and the propagation constant of the auxiliary circuit 17, now arranged in the useful signal path, increasing with increasing useful signal.

In order to prevent the initially mentioned overswing of the treated useful signal at the output terminal, especially upon relatively rapid changes of the useful signals by a relatively large amount, limiting means are provided. These limiting means consist in the present case of two diodes 21 and 22 oppositely connected, which are arranged between the first connection point 19 and the second connection point 18 of the auxiliary circuit 17. The diodes 21 and 22 limit the signal voltages occurring between the first connection point 19 and the second connection 18 of the auxiliary circuit 17 and momentarily increase the propagation constant of the auxiliary circuit 17. The limiting is effected by reason of the diodes 21 and 22 having a threshold value above which their resistance becomes very small and hence the damping of the auxiliary circuit 17 likewise becomes very small.

However, it is now possible that the components used in the electronically controllable adjusting member 28, e.g. field effect transistors, are endangered upon the occurrence of a voltage the value of which is equal to the above-mentioned threshold value of the limiting means 21, 22, or at only smaller voltages they no longer operate satisfactorily. For this case, in the circuit according to the invention means are provided which reduce the maximum drop across the diodes 21 and 22 relative to the adjusting member 28 to a value such that the corresponding signals, can be dealt with without difficulty by the electronically controllable adjusting member 28. For this purpose the electronically controllable damping member 26, which includes the electronically controllable adjusting member 28, is connected via a damping member 29 to the first connection point 19 of the auxiliary circuit 17 and on the other hand is connected via an amplifying member 25 to the second connection point 18 of the auxiliary circuit 17. The damping member 29 has the effect that the signal voltage occurring at the first connection point 19 of the auxiliary circuit 17 is sub-divided to a value such as can be dealt with by the electronically controllable adjusting member 28 without difficulty. The signal voltage that can be taken off after the electronically controllable damping member 26 is then amplified by means of the amplifying member 25. The amplification of the amplifying member 25 is such that the damping effected by the damping member 29 in the signal path containing the electronically controllable damping member 26 is compensated by the amplification of the amplifying member 25. In this manner the two signal paths with the diodes 21 and 22 on the one hand and the components 29, 26, 25 on the other hand are so matched to one another that the signal path containing the electronically controllable adjusting member 28 can still deal with signal values such as in themselves cannot be dealt with by the electronically controllable adjusting member 28.

It is not absolutely necessary for the amplification of the amplifying member 25 to be so high that it corresponds to the damping of the damping member 29. With larger differences between the amplification of the amplifying member 25 and the damping of the damping member 29 the matching of the electronically controllable damping member 26 to the diodes 21 and 22 is however no longer present in the required sense.

In order to improve the matching still further, it is advantageous to make the output impedance of the amplifying member 25 of the auxiliary circuit 17 large, or arrange between the output of the amplifying member 25—to the extent that this has a low output impedance—and the second connection point 18 of the auxiliary circuit 17 a resistor 24 the resistance of which is so selected that on the one hand it is large compared with the output resistance of the amplifier 4 and on the other hand it is small compared with the input resistance of the input of an amplifier fed from the terminal 18. In this manner it is ensured that the signal voltage occurring at the second connection point 18 of the auxiliary circuit 17 cannot become smaller or larger respectively than the signal voltage at the first connection point 19 of the auxiliary circuit 17 minus or plus the threshold voltage of the diodes 21 and 22.

It may also be desired to make the limiting effective only during compression or only during expansion. In this case it is possible to switch off the limiting means 21 and 22 by means of a switch 23. Instead of the said switch 23, in accordance with the practical example in FIG. 2 the low-ohmic output of the amplifying member 25 may be connected to a third connection point 30 of the auxiliary circuit 17, since the limiting means 21, 22 are ineffective for the signals occurring at this connection point 30.

Figure 2:
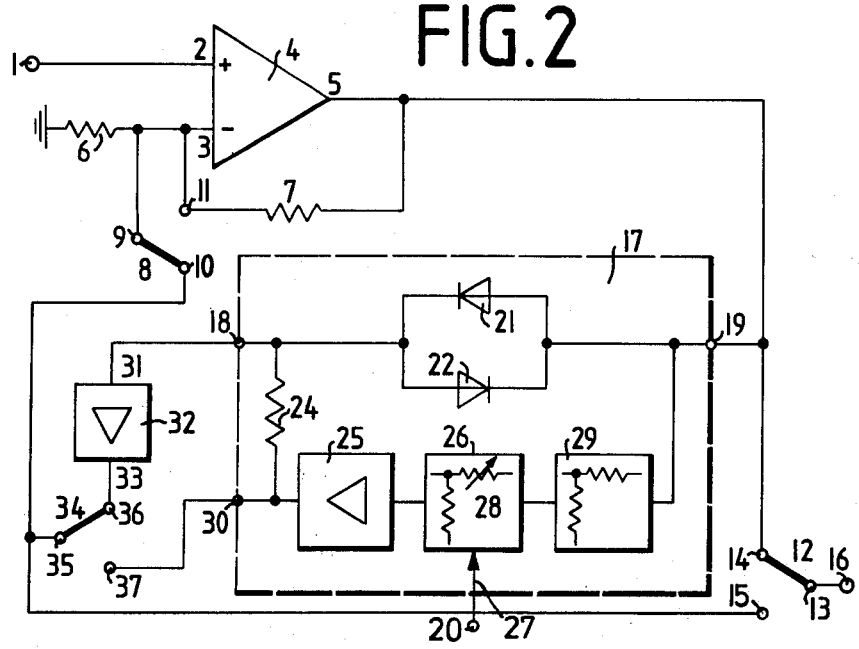

In the change-over between compression and expansion described it is not absolutely necessary for the negative feedback resistor 7 to be switched for the case in which the auxiliary circuit 17 is arranged in the negative feedback branch. As illustrated in FIG. 2, the negative feedback resistor 7 may be continuously connected to the inverting input 3 of the amplifier 4, particularly if the resistance of the negative feedback resistor 7 is appreciably larger than the value of the resistor 24 or the output resistance of the amplifying member 25.

If this is not ensured, an impedance converter may be provided. In the circuit according to FIG. 2 there is arranged a separating amplifier 32 constructed as an impedance converter, the input 31 of which is connected to the second connection point 18 of the auxiliary circuit 17 and the output 33 of which is connected to a first contact 36 of a third switch 34. The third switch 34 serves for selective switching of the limiting on and off. The second contact 37 of the third switch 34 is thus connected to the third connection point 30 of the auxiliary circuit 17, at which signals can be taken off without the action of the limiting means 21, 22. The middle contact 35 of the third switch 34 is connected to the second contact 15 of the first switch 12 and to the first contact 10 of the second switch 8. In the setting of the third switch 34 as drawn the limiting means 21 and 22 are effective.

The separating amplifier 32 is of such dimensions that it has e.g. an amplification factor of unity and in the usual manner a relatively low-ohmic output. Since the output 5 of the differential amplifier 4 is, as in the case of conventional differential amplifiers, made relatively low-ohmic the resistor 7 is therefore located between two connection points (output 5 of the differential amplifier 4 and output 33 of the separating amplifier 32) which are low-ohmic. Hence its effect on the negative feedbranch between the output 5 and the input 3 of the differential amplifier 4 is negligible in practice.

If however the influence of the resistor can be neglected for the above reasons, then in practice only (as in FIG. 1) the controllable impedance is located between the output 5 and the input 3 of the differential amplifier 4. Thus the circuit according to FIG. 2 operates like the circuit of FIG. 1 in the switch settings illustrated.

For changing over the control characteristics of the differential amplifier 4 the switches 8 and 12 are changed over. In this operating condition there is then located between the output 5 and the input 3 of the differential amplifier 4 only the resistor 7. The amplification of the differential amplifier 4 then is constant. Via the separating amplifier 32 the signals are fed to the contact 15 of the switch 12, so that these signals can be taken off at the output terminal 16.

Compared with the circuit according to FIG. 1, in the last-described operating condition, in which the output terminal 16 is connected directly to the junction 18, the circuit according to FIG. 2 has the advantage that in this case there can be taken off at the output terminal 16 output signals which by reason of the low output resistance of the separating amplifier 32 can be relatively strongly loaded.

Whilst in the circuit according to FIG. 1 during the change-over operation, i.e. during that time in which the switch contact of the switch 8 is between the contacts 10 and 11, the inverting input 3 of the differential amplifier 4 is not fed by signals of negative feedback, in the circuit according to FIG. 2, said inverting input 3 is continuously connected via the resistor 7 to the output 5. In the circuit according to FIG. 2, during the change-over of the control characteristic of the differential amplifier 4 there is therefore no instant at which the differential amplifier 4 can assume uncontrolled conditions.

The separating amplifier 32 may also be so constructed that its propagation constant is frequency-dependent. Since the propagation characteristic upon change-over between compression and expansion, is likewise change over in complementary manner, there results a linear frequency curve for compression and expansion together. A frequency-dependent characteristic of propagation of the current arrangement is advantageous when the circuit arrangement serves for the recording and reproduction of LF signals on magnetic sound carriers. Owing to the pre-emphasis usual in recording, the magnetic sound carrier attains at high levels and high frequencies a form of saturation which leads to the LF bandwidth at high levels being smaller than at medium and low levels. By a reduction of the high frequencies during recording and an increase of the high frequencies during reproduction a narrowing of the LF bandwidth at high levels can be avoided. It is true that with this step there is in itself a poorer interference spacing at low levels; this is however more than compensated by the action of the compander.

If the separating amplifier 32 is e.g. constructed as a lowpass the circuit described operates during expansion as an expansion circuit with a following lowpass. During compression the circuit described then operates as a compression circuit with a preceding highpass. Correspondingly, an expansion circuit with following highpass and a compression circuit with preceding lowpass results if the separating amplifier 32 behaves like a highpass.

It is also possible so to construct the first or second damping or amplifying member 29 or 25 and/or the separating amplifier 32 that their propagation constants are selectively linear or frequency-dependent.

Further, it is possible to provide an amplifying member instead of the damping member 29 in the circuit described and correspondingly to provide a damping member instead of the amplifying member 25. In such a case the voltage drop over the signal path including the electronically controllable adjusting member 28 is raised.

The above-described circuit arrangement is also capable of use when the auxiliary circuit 17 is so controlled in relation to the resistance of the electronically controllable adjusting member 28 that the said resistance decreases with increasing useful signal voltage. In the setting of the switches 12 and 8 illustrated there is then located in the negative feedback path of the amplifier 4 a compression circuit; at the output of the amplifier 4 an expanded signal can therefore be taken off. Correspondingly, the output terminal 16 provides a compressed signal in the setting of the switches 12 and 8 not illustrated.

What is claimed is:

1. In a circuit arrangement for automatic dynamic compression and/or expansion, which circuit arrangement includes an input terminal, an output terminal, an amplifier connected to present a forward conducting path for useful signals between the input and output terminals, means connected to the amplifier to define a negative feedback path therefor, and an auxiliary circuit having first and second connection points via which the auxiliary circuit is connected in one of the paths, the improvement wherein said auxiliary circuit comprises: a series-connected assembly of a first damping member, an electronically controllable damping member and an amplifying member connected between said first and second connection points; and signal amplitude limiting means connected in parallel with said series-connected assembly between the first and second connection points for limiting the amplitude of the signal in said assembly.

2. Circuit arrangement according to claim 1, further comprising switches (8,12) for the selective connection of said auxiliary circuit (17) in either one of said paths.

3. Circuit arrangement according to claim 1, characterised in that the limiting means consist of oppositely connected diodes (21, 22).

4. Circuit arrangement according to claim 1, further comprising an additional switch (23) connected between said limiting means (21, 22) and one of said connection points (19, 18).

5. Circuit arrangement according to claim 1, characterised in that said amplifying member (25) has a high output impedance.

6. Circuit arrangement according to claim 1, characterised in that said amplifying member (25) has a low output impedance and wherein said assembly further includes an ohmic resistor (24) is arranged between the output of said amplifying member (25) and said second connection point (18).

7. Circuit arrangement according to claim 5 or 6, characterised in that the output resistance of one of said amplifying member (25) and said ohmic resistor (24) is large compared with the output resistance of said amplifier (4).

8. Circuit arrangement according to claim 7, characterised in that the output resistance of one of said amplifying member (25) and said ohmic resistor (24) is small compared with the input resistance of the signal path fed from said second connection point (18).

9. Circuit arrangement according to claim 1, characterised in that said negative feedback path includes a negative feedback resistor and said amplifier (4) has a non-inverting input (2) connected to said input terminal, an output (5) connected to one end of said negative feedback resistor (7) and to said first connection point (19) of said auxiliary circuit (17), and an inverting input, further comprising a first switch having a first contact connected to said amplifier output, and a second switch having a first contact connected to said second connection point, a second contact connected to the other end of said negative feedback resistor and a middle contact connected to said amplifier inverting input and selectively connectable to either one of said first and second contacts of said second switch.

10. Circuit arrangement according to claim 9, characterised in that the other end of said negative feedback resistor (7) is directly connected to the inverting input (3) of said amplifier (4) and that the resistance of said negative feedback resistor (7) is appreciably higher than the output resistance (24) of said amplifying member (25) of said auxiliary circuit (17).

11. Circuit arrangement according to claim 9, further comprising a separating amplifier and characterised in that said second connection point (18) of said auxiliary circuit (17) is connected to an input (31) of said separating amplifier (32) and that the output (33) of said separating amplifier (32) is connected to said first contact (10) of said second switch (8), and that said first switch has a second contact (15) connected to the output of said separating member.

12. Circuit arrangement according to claim 11, characterised in that said auxiliary circuit has a third connection point, and said amplifying member has a low-ohmic output connected to said third connection point (30) of said auxiliary curcuit (17), and further comprising a third switch having a first contact, a second contact and a middle contact selectively connectable to either one of said first and second contacts of said third switch, said second contact of said third switch being connected to said third connecting point, said first contact of said third switch being connected to the output of said separating amplifier, and said middle contact (35) of said third switch (34) is connected to said second contact (15) of said first switch (12) and to said first contact (10) of said second switch (8).

13. Circuit arrangement according to claim 11 or 12, characterised in that said separating amplifier (32) has the propagation constant of approximately 1 and its output impedance is appreciably smaller than the resistance of said negative feedback resistor (7).

14. Circuit arrangement according to claim 11 or 12, characterised in that the propagation constant of said separating amplifier (32) is frequency-dependent.

15. Circuit arrangement according to claim 14, characterised in that said separating amplifier (32) behaves like one of a lowpass and a highpass filter.

16. Circuit arrangement according to claim 1, characterised in that the propagation constant of said amplifying member (25) is frequency-dependent.

17. Circuit arrangement according to claim 1, characterised in that the propagation constant of said first damping member (29) is frequency-dependent.

* * * * *